United States Patent [19]

Hong et al.

[11] Patent Number: 5,134,635
[45] Date of Patent: Jul. 28, 1992

[54] CONVOLUTIONAL DECODER USING SOFT-DECISION DECODING WITH CHANNEL STATE INFORMATION

[75] Inventors: Daehyoung Hong, Hanover Park; Steven C. Jasper, Hoffman Estates; Mark R. Poulin, Elmwood Park, all of Ill.

[73] Assignee: Motorola, Inc., Schaumburg, Ill.

[21] Appl. No.: 560,537

[22] Filed: Jul. 30, 1990

[51] Int. Cl.$^5$ ............................................ H04L 27/06
[52] U.S. Cl. .......................................... 375/94; 371/43
[58] Field of Search ........................ 375/34, 39, 42, 52, 375/53, 57, 58, 94; 371/43, 44, 45; 329/304, 310

[56] References Cited

U.S. PATENT DOCUMENTS

| | | | |
|---|---|---|---|
| 4,015,238 | 3/1977 | Davis | 371/43 |
| 4,240,156 | 12/1980 | Doland | 371/43 |
| 4,536,878 | 8/1985 | Rattingourd | 371/43 |
| 4,601,044 | 7/1986 | Kramer, III et al. | 371/43 |
| 4,700,349 | 10/1987 | Gallager | 375/25 |
| 4,829,543 | 5/1989 | Borth et al. | 375/83 |
| 4,833,693 | 5/1989 | Eyuboglu | 375/34 |
| 4,868,830 | 9/1989 | Pollard-Bozzola | 371/43 |
| 4,891,806 | 1/1990 | Farias et al. | 375/39 |
| 4,907,233 | 3/1990 | Deutsch et al. | 371/43 |
| 4,932,029 | 6/1990 | Heichler | 371/43 |
| 4,945,549 | 7/1990 | Simon et al. | 375/57 |
| 5,010,554 | 4/1991 | Bechtel et al. | 371/37.8 |

FOREIGN PATENT DOCUMENTS 59-012646 1/1984 Japan .

OTHER PUBLICATIONS

Y. Yasuda, Y. Hirata and A. Ogawa, "Optimum Soft Decision for Viterbi Decoding", Proc. 5th Int. Conf. on Digital Satellite Communications, pp. 251-258, Mar. 1981.

D. Divsalar and M. K. Simon, "Trellis Coded Modulation for 4800-9600 bits/s Transmission Over a Fading Mobile Satellite Channel", IEEE Journal on Selected Areas in Communications, vol. SAC-5, No. 2, pp. 162-175 Feb. 1987.

R. D'Avella, L. Moreno and E. Turco, "Adaptive Equalization and Viterbi Decoding for Digital Mobile Radio Systems", Proc. IEEE Globecom '89, pp. 3.3.1-3.3.5, Nov. 1989.

S. Sampei and T. Sunaga, "Rayleigh Fading Compensation Method for 16QAM in Digital Land Mobile Radio Channels", Proc. IEEE Vehicular Technology Conf., pp. 640-646, May 1989.

M. Mosher and J. Lodge, "TCMP-A Modulation and Coding Strategy for Rician Fading Channels", IEEE Journal on Selected Areas in Communications, vol. 7, No. 9, pp. 1347-1355, Dec. 1989.

*Primary Examiner*—Stephen Chin
*Attorney, Agent, or Firm*—Susan L. Lukasik; Raymond A. Jenski; Steven G. Parmelee

[57] ABSTRACT

A convolutional decoder which assigns bit metrics to at least one bit of a symbol in a multilevel system. This decoder uses soft-decision Viterbi decoding with channel state information of a convolutionally-encoded communication transmitted using multilevel modulation.

41 Claims, 2 Drawing Sheets

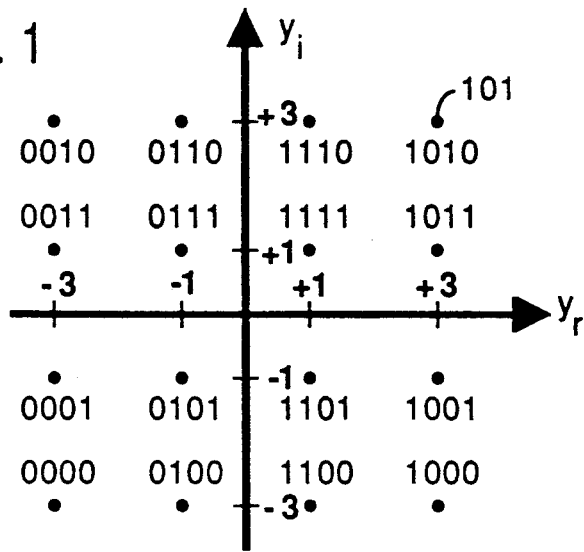
FIG. 1
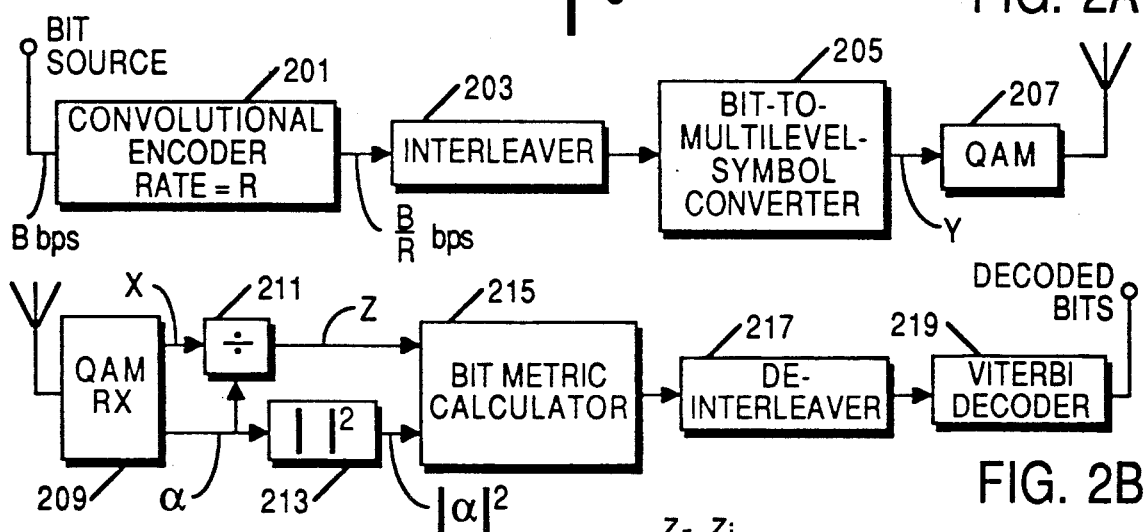
FIG. 2A
FIG. 2B
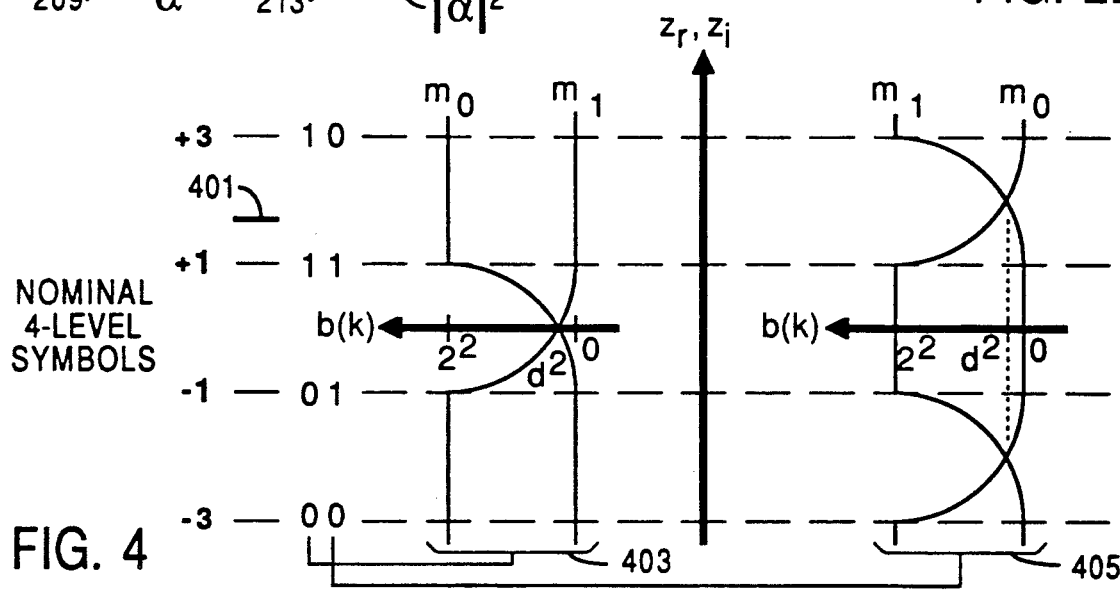
FIG. 4

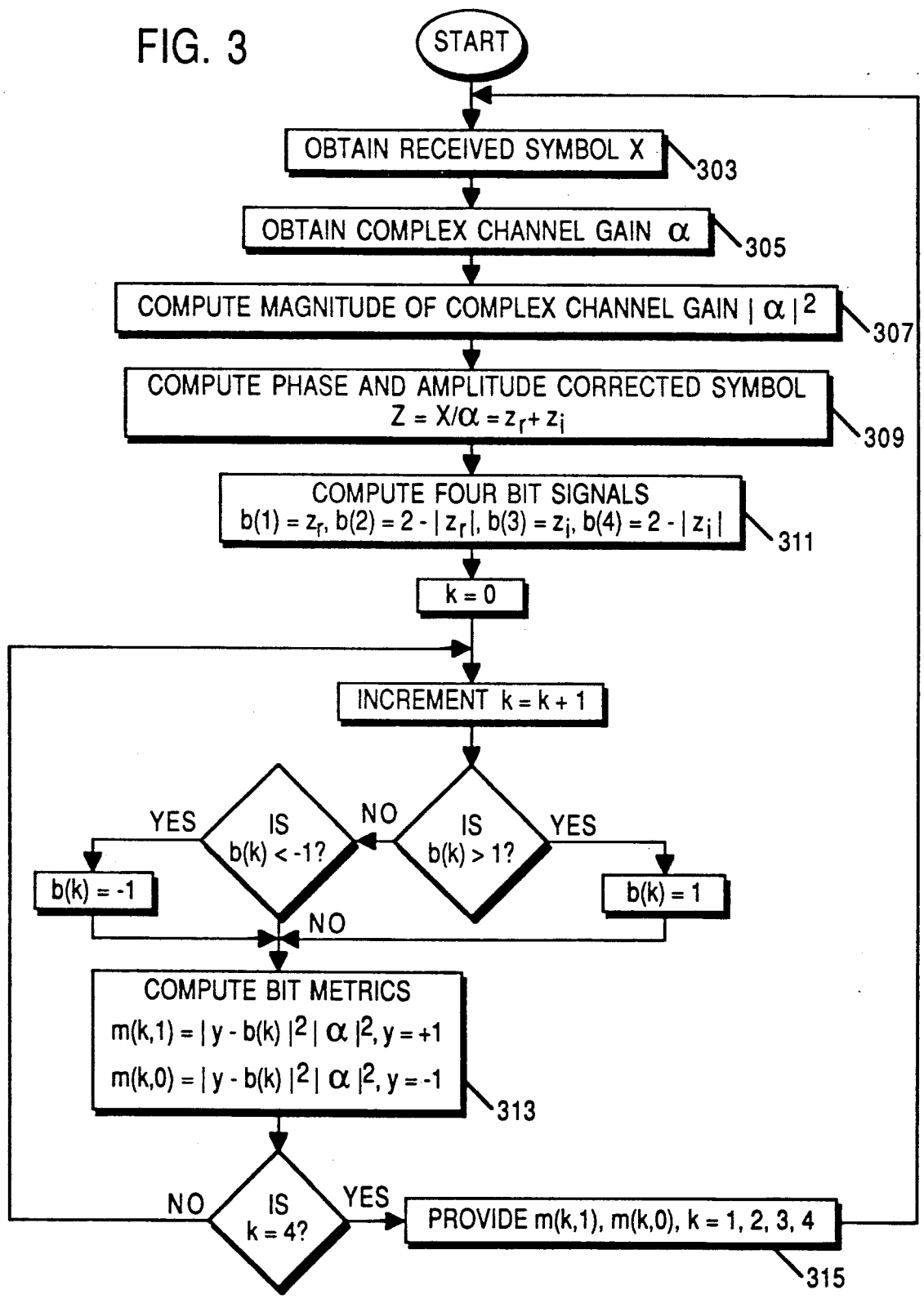

CONVOLUTIONAL DECODER USING SOFT-DECISION DECODING WITH CHANNEL STATE INFORMATION

FIELD OF THE INVENTION

This invention is concerned with digital demodulation with error correction.

More particularly, this invention is concerned with soft-decision decoding of digital modulation for multilevel signalling.

BACKGROUND OF THE INVENTION

Bit errors are introduced when digitized bits are transferred through a communication medium. Correcting these errors is vital to insure reliable communications.

It is well recognized that better decisions can be made about the actual value of a received symbol with the availability of soft information. That is, if it were known to the decoder during error correction what the quality of the signal was when the symbol was received, a better decision could ultimately be made about the true value of the transmitted symbol. Soft information represents a measure of the confidence held in any given symbol detection. Soft-decision decoding operates on a recovery scheme having a number of possible values greater than the number of symbols in the set. Further description of soft-decision decoding may be found in U.S. Patent Application No. 07/422177, filed on Oct. 13, 1989 on behalf of Gerald Labedz et al, titled "Soft Decision Decoding With Channel Equalization."

When utilizing convolutional coding with Viterbi decoding, improved BER (Bit Error Rate) performance was obtained in the past by using soft-decision decoding of BPSK (Binary Phase-Shift Keying) signalling. The Euclidean distance between the transmitted and received signal levels was used as the metric in the maximum-likelihood decision process carried out by the Viterbi algorithm. Further improvement was obtained for trellis coded modulation with Viterbi decoding by using the signal amplitude as channel state information for the soft-decision decoding.

In some applications, such as radio communications, high spectrum efficiency is very desirable. This requires high bit rate in a small bandwidth and is achievable by using multilevel signalling. Thus, in a multilevel system, a symbol represents a plurality of bits. Amplitude/phase modulation techniques increase spectral efficiency at the expense of sensitivity. 16QAM (Quadrature Amplitude Modulation) is such a technique. In this signalling process and other modulations employing amplitude shifting, the received signal strength is a function not only of the channel state, but also of the transmitted bit information. Thus, obtaining channel state information from received signal strength for soft-decision decoding is not a simple problem.

In addition, bit or symbol interleaving is a common procedure used to combat burst bit error characteristics that are generated in a fading environment. The interleaving process takes consecutive bits or symbols and rearranges their time-domain order so that any collection of bits or symbols that is combined into another symbol does not suffer as much under burst error conditions. Interleaving, when combined with multilevel signalling, further complicates the problem of obtaining soft-decision/channel state information on a bitwise basis for use in convolutional decoding.

Among the previous solutions, only binary signalling such as BPSK or Quadrature PSK, which is simply BPSK transmitted in quadrature, is addressed. There is no defined way to obtain soft-decision/channel state information on a bit basis for a multilevel signalling system. Therefore, a good process of determining bitwise or symbol-wise channel state information for soft-decision decoding is required.

SUMMARY OF THE INVENTION

This invention encompasses a convolutional decoder for decoding a data message in a multilevel system by recovering a symbol representing a plurality of bits and assigning at least two bit metrics to at least one bit of the recovered symbol.

BRIEF DESCRIPTION OF THE DRAWINGS

FIG. 1 is a depiction of a 16QAM symbol constellation.

FIGS. 2A and 2B are a pair of block diagrams depicting a transmitter/receiver suitable for use in transmitting/receiving a signal in accordance with the invention.

FIG. 3 is a flow diagram illustrating the steps executed to calculate the bit metrics in accordance with the invention.

FIG. 4 is a diagram illustrating modified Euclidean distance in accordance with the invention.

DETAILED DESCRIPTION OF THE PREFERRED EMBODIMENT

The preferred embodiment of this invention uses 16QAM for the multilevel signalling modulation technique. FIG. 1 shows the signal constellation for 16QAM. The encoded and transmitted symbol is represented by $Y=(y_r+jy_i)$, where $y_r$ is the real axis component of the transmitted symbol and $y_i$ is the imaginary axis component. The four bits represented by each symbol in the preferred embodiment are shown, where reference numeral 101 indicates the symbol representing the four binary bits "1010." Values $\pm 1$ and $\pm 3$ in FIG. 1 are the values used in the preferred embodiment of the invention.

FIG. 2 depicts a pair of block diagrams representing a transmitter (2A) and receiver (2B) suitable for use in transmitting and receiving a signal in accordance with the invention. The channel through which the signal from the transmitter (2A) is conveyed to the receiver (2B) imparts a time-varying, amplitude-fading, and phase rotation to the signal thereby yielding a received signal having amplitude and phase related to the transmitted signal but distorted by the channel. The receiver (2B) must attempt to correct the distortion by determining the channel state and applying appropriate and time-varying counter-measures.

In the convolutional encoder (201) of FIG. 2, B bps (bits per second) are error encoded at rate R, where $R<1$. The output of the convolutional encoder is fed into an interleaver (203) at B/R bps to reduce the effect of burst errors. After the interleaver, the information enters the bit-to-multilevel-symbol converter (205), where a plurality of bits from the interleaver are conventionally compressed into one multilevel symbol, Y. The sequence of symbols is then filtered and quadrature-amplitude modulated (207) to the desired channel specification, as is well understood in the art.

The QAM receiver (209) demodulates the received signal, providing the demodulated symbol sample X, which has undergone channel amplitude and phase distortion, and $\alpha$, an estimate of this amplitude and phase distortion in the form of a complex channel gain.

Various methods can be used to estimate the comlex channel gain. The preferred embodiment of the invention uses an embedded time-domain pilot symbol insertion process to compensate for multipath fading in land mobile radio channels by recovery of the pilot symbol, as described in U.S. patent application No. 07/536825, filed on Jun. 12, 1990 on behalf of Steven Jasper, titled "Communication Signal Having a Time Domain Pilot Component." Briefly, a known pilot symbol is periodically inserted into the symbol stream before modulation. This pilot symbol sequence is processed by the receiver to provide the channel state information: the complex channel gain corresponding to each received symbol. Alternatively, a frequency domain pilot tone may be used to provide an amplitude/phase reference for the receiver.

To calculate the bit metric, the preferred embodiment defines $X/\alpha$ as $Z = (z_r + jz_i)$, where Z is the amplitude and phase corrected symbol. The divider (211) performs this complex division operation to find Z. The magnitude squared of the complex channel gain, $|\alpha|^2$, is also calculated (213). Z and $|\alpha|^2$ are passed on to the bit metric calculator (215) of FIG. 2.

Referring to the bit metric calculator (215), it can be assumed that the received symbol sample is denoted by $X = (x_r + jx_i)$, and the complex channel gain is $\alpha = (\alpha_r + j\alpha_i)$. The optimum metric is based on the weighted Euclidean distance measure, which takes into account the Euclidean distance between the original transmitted symbol, Y, and the amplitude/phase-corrected symbol sample, Z, and the channel state in terms of its squared magnitude:

$$m = |X - Y\alpha|^2 = |Y - X/\alpha|^2 |\alpha|^2 = |Y - Z|^2 |\alpha|^2 \qquad (1)$$

Whenever multilevel amplitude/phase modulation is used and interleaving and convolutional coding is performed on a bit basis, it may not be possible to use Equation (1) directly. In such cases, the present invention provides a means of determining the bit metrics needed in the decoding process. A bit metric is a number reflecting the confidence level that a bit is a binary "1" or "0." For 16QAM of the preferred embodiment, each symbol consists of four bits, and each bit must be assigned two bit metrics, one representing the likelihood that the bit is a binary "1" and the other representing the likelihood that the bit is a binary "0." Hence, the symbol metric m is divided into eight bit metrics, m(k,1) and m(k,0), where k = 1, 2, 3, 4. The present invention offers a technique of calculating the bit metrics.

As mentioned previously, the preferred embodiment of the present invention defines $X/\alpha$ as $Z = (z_r + jz_i)$. For 16QAM, the process of assigning the bit metrics can be simplified by separating the complex numbers Z and Y into their real and imaginary components, each corresponding to two bits. Then the received and corrected signal, Z, is divided into four received and corrected bit signals as follows:

$$b(1) = \begin{cases} 1 & \text{if } z_r > 1 \\ z_r & \text{if } -1 \leq z_r \leq 1 \\ -1 & \text{otherwise} \end{cases} \qquad (2)$$

$$b(2) = \begin{cases} 1 & \text{if } 2 - |z_r| > 1 \\ 2 - |z_r| & \text{if } -1 \leq 2 - |z_r| \leq 1 \\ -1 & \text{otherwise} \end{cases}$$

$$b(3) = \begin{cases} 1 & \text{if } z_i > 1 \\ z_i & \text{if } -1 \leq z_i \leq 1 \\ -1 & \text{otherwise} \end{cases}$$

$$b(4) = \begin{cases} 1 & \text{if } 2 - |z_i| > 1 \\ 2 - |z_i| & \text{if } -1 \leq 2 - |z_i| \leq 1 \\ -1 & \text{otherwise} \end{cases}$$

In the preferred embodiment, two bit metrics for each of the four bits can be obtained as follows:

$$m(k,1) = |y - b(k)|^2 |\alpha|^2, y = 1$$

$$m(k,0) = |y - b(k)|^2 |\alpha|^2, y = -1$$

where $k = 1, 2, 3, 4$ \qquad (3)

Thus, each of the four bits from the received symbol is represented by two bit metrics, m(k,1) and m(k,0), which are a function of the resolved bits and the channel gain. These bit metrics convey both the best selection of a bit value and the condition of the channel as characterized by the channel gain factor, $\alpha$, produced by the QAM receiver (209) to compensate for channel characteristics. In effect, the two bit metrics representing each bit correspond to the likelihood that the bit is a binary "1" and the likelihood that the bit is a binary "0."

For another view of the bit metric calculator (215), a general expression for equation 3 can be written $m(k,a) = d_{ka}^2 |\alpha|^2$, where a represents the binary values "0" or "1", and $d_{ka}$ represents the modified Euclidean distance, shown in FIG. 4, and $d_{ka} = |(-1)^{a+1} - b(k)|$. The lower the value of the specific bit metric, the higher the likelihood that the bit is representative of the bit metric's associated binary value. For the example (401) shown in FIG. 4, the sample symbol has a level of 5/3. To decode the left-most bit in this half-symbol (referring to the left-hand curves (403) of FIG. 4), $m_0$ shows a value of $2^2$, $m_1$ shows a value of $\sim 0$. Thus, it is likely that this bit is a binary "1," since $0 < 4$. Similarly, for the right-most bit in this half-symbol (referring to the right-hand curves (405) of FIG. 4), $m_0$ shows a value of $(4/3)^2$, and $m_1$ shows a value of $(\frac{2}{3})^2$. Here it is also likely that the bit is a binary "1," since $0.444 < 1.777$. It is therefore likely that the value of the 2-bit symbol is binary "11." The Viterbi decoder (219) actually makes final determination of each binary value on the basis of the sequence of deinterleaved metrics it is provided.

FIG. 3 is a flowchart depicting the process of the preferred embodiment to calculate the bit metrics. Summarizing the bit metric process, the received symbol, X, is obtained (303), the complex channel gain, $\alpha$, is obtained (305), the magnitude squared of the complex channel gain, $|\alpha|^2$, is computed (307), and the phase and amplitude corrected symbol, Z, is computed (309). The real and imaginary components of Z are used to compute (311) the four bit signals, which are used to compute (313) the bit metrics. The de-interleaver (217) takes the provided bit metrics (315) and returns them to their proper time-domain order. Convolutional decoding is completed by a conventional Viterbi decoder (219).

Processes depicted by reference numerals 211, 213, 215, 217, and 219 in FIG. 2 are resident in a DSP (Digital Signal Processor) in the preferred embodiment. Such a DSP may be a DSP56001, available from Motorola, Inc.

We claim:

1. A convolutional decoder for decoding a data message comprised of a plurality of multilevel symbols, the decoder comprising:
   means for recovering at least one symbol representing a plurality of bits;
   means for assigning at least two bit metrics to at least one bit of said recovered at least one symbol, wherein a bit metric is a number reflecting a confidence level that said at least one bit is a binary "1" or "0"; and
   means for determining a binary value for said at least one bit from said at least two bit metrics.

2. A convolutional decoder in accordance with claim 1 further comprising means for obtaining channel state information.

3. A convolutional decoder in accordance with claim 2 wherein said means for assigning further comprises means for combining said channel state information to calculate said assigned at least two bit metrics.

4. A convolutional decoder in accordance with claim 3 further comprising means for coupling said assigned at least two bit metrics to means for Viterbi decoding to recover the data message.

5. A convolutional decoder in accordance with claim 4 wherein said means for coupling further comprises means for de-interleaving said assigned at least two bit metrics.

6. A convolutional decoder in accordance with claim 1 wherein said means for assigning further comprises means for determining a modified Euclidean distance.

7. A method of improved error correction in a convolutional decoder that decodes a data message comprised of a plurality of multilevel symbols, comprising the steps of:
   recovering at least one symbol representing a plurality of bits;
   assigning at least two bit metrics to at least one bit of said recovered at least one symbol, wherein a bit metric is a number reflecting a confidence level that said at least one bit is binary "1" or "0" and
   determining a binary value for said at least one bit from said at least two bit metrics.

8. The method of claim 7 further including the step of obtaining channel state information.

9. The method of claim 8 further including the step of combining said channel state information to calculate said assigned at least two bit metrics.

10. The method of claim 9 further including the step of coupling said assigned at least two bit metrics and Viterbi decoding to recover the data message.

11. The method of claim 10 further including the step of de-interleaving said assigned at least two metrics.

12. The method of claim 7 further including the step of determining a modified Euclidean distance.

13. A digital receiver employing a convolutional decoder for decoding a data message comprised of a plurality of multilevel symbols, said digital receiver comprising:
   means for recovering at least one symbol representing a plurality of bits;
   means for assigning at least two bit metrics to at least one bit of said symbol, wherein a bit metric is a number reflecting a confidence level that said at least one bit is a binary "1" or "0";
   means for obtaining channel state information coupled to said means for assigning;
   means for combining said channel state information with at least one bit of said recovered at least one symbol; and
   means for determining a binary value for said at least one bit from said at least two bit metrics.

14. A digital receiver in accordance with claim 13 further comprising means for de-interleaving said assigned at least two bit metrics.

15. A digital receiver in accordance with claim 13 further comprising means for coupling said assigned at least two bit metrics to a means for Viterbi decoding to recover the data message.

16. A convolutional decoder for decoding a data message comprised of a plurality of multilevel symbols, the decoder comprising:
   means for obtaining at least one received symbol representing a plurality of bits;
   means for obtaining complex channel gain from said at least one received symbol;
   means, coupled to said means for obtaining said complex channel gain, for computing magnitude squared of said complex channel gain;
   means for computing a phase and amplitude corrected symbol from said at least one received symbol and said complex channel gain;
   means, coupled to said means for computing said phase and amplitude corrected symbol, for computing bit signals;
   means, coupled to said means for computing said magnitude squared of said complex channel gain and said means for computing said bit signals, for assigning at least two bit metrics to at least one bit of said at least one received symbol, wherein a bit metric is a number reflecting a confidence level that said at least one bit is a binary "1" or "0"; and
   means for determining a binary value for said at least one bit from said at least two bit metrics.

17. A convolutional decoder in accordance with claim 16 further comprising means for de-interleaving said assigned at least two bit metrics.

18. A convolutional decoder in accordance with claim 16 further comprising means for Viterbi decoding of said assigned at least two bit metrics.

19. A method of improved error correction in a convolutional decoder for decoding a data message comprised of a plurality of multilevel symbols, comprising the steps:
   obtaining at least one received symbol representing a plurality of bits;
   obtaining complex channel gain from said at least one received symbol;
   computing magnitude squared of said complex channel gain from said complex channel gain;

computing a phase and amplitude corrected symbol from said at least one received symbol and said complex channel gain;

computing bit signals from said computed phase and amplitude corrected symbol;

assigning, responsive to said computing of said magnitude squared of said complex channel gain and said computing of said bit signals, at least two bit metrics to at least one bit of said at least one received symbol, wherein a bit metric is a number reflecting a confidence level that said at least one bit is a binary "1" or "0"; and determining a binary value for said at least one bit from said at least two bit metrics.

20. The method of claim 19 further including the step of de-interleaving said assigned at least two bit metrics.

21. The method of claim 19 further including the step of Viterbi decoding of said assigned at least two bit metrics.

22. A decoder for decoding a data message comprised of a plurality of multilevel symbols, the decoder comprising:

means for obtaining at least one received symbol representing a plurality of bits;

means for computing at least two bit signals for said obtained at least one received symbol;

means, coupled to said means for computing, for assigning at least two bit metrics from said computed at least two bit signals, wherein a bit metric is a number reflecting a confidence level that said at least one bit is a binary "1" or "0"; and means for determining a binary value for said at least one bit from said at least two bit metrics.

23. A decoder in accordance with claim 22, further comprising means for obtaining channel state information.

24. A decoder in accordance with claim 23, wherein said means for computing further comprises means for combining said at least two bit signals with said channel state information.

25. A decoder in accordance with claim 22, further comprising means for de-interleaving said assigned at least two bit metrics.

26. A decoder in accordance with claim 22, further comprising means for Viterbi decoding of said assigned at least two bit metrics.

27. A decoder in accordance with claim 22, wherein said means for computing further comprises means for determining a modified Euclidean distance.

28. A decoder in accordance with claim 22, wherein said means for computing further comprises means for obtaining complex channel gain from said at least one received symbol.

29. A decoder in accordance with claim 28, wherein said means for computing further comprises means, coupled to said means for obtaining said complex channel gain, for computing magnitude squared of said complex channel gain.

30. A decoder in accordance with claim 29, wherein said means for computing further comprises means for computing a phase and amplitude corrected symbol from said at least one received symbol and said complex channel gain.

31. A decoder in accordance with claim 30, wherein said means for computing further comprises means for computing bit signals from said computed phase and amplitude corrected symbol.

32. A method of decoding a data message comprised of a plurality of multilevel symbols, comprising the steps of:

obtaining at least one received symbol representing a plurality of bits;

computing at least two bit signals for said obtained at least one received symbol;

assigning, responsive to said computing step, at least two bit metrics from said computed at least two bit signals, wherein a bit metric is a number reflecting a confidence level that said at least one bit is a binary "1" or "0"; and determining a binary value for said at least one bit from said at least two bit metrics.

33. The method of claim 32, further comprising the step of obtaining channel state information.

34. The method of claim 33, wherein said computing step further comprises the step of combining said at least two bit signals with said channel state information.

35. The method of claim 32, further comprising the step of de-interleaving said assigned at least two bit metrics.

36. The method of claim 32, further comprising the step of Viterbi decoding of said assigned at least two bit metrics.

37. The method of claim 32, wherein said computing step further comprises the step of determining a modified Euclidean distance.

38. The method of claim 32, wherein said computing step further comprises the step of obtaining complex channel gain from said at least one received symbol.

39. The method of claim 38, wherein said computing step further comprises the step of computing magnitude squared of said complex channel gain from said complex channel gain.

40. The method of claim 39, wherein said computing step further comprises the step of computing a phase and amplitude corrected symbol from said at least one received symbol and said complex channel gain.

41. The method of claim 40, wherein said computing step further comprises the step of computing bit signals from said computed phase and amplitude corrected symbol.

* * * * *